United States Patent
Sugahara et al.

(10) Patent No.: US 7,479,729 B2
(45) Date of Patent: Jan. 20, 2009

(54) PIEZOELECTRIC ACTUATOR, INK-JET HEAD PROVIDED WITH THE SAME, INK-JET PRINTER, AND METHOD FOR MANUFACTURING PIEZOELECTRIC ACTUATOR

(75) Inventors: Hiroto Sugahara, Ama-gun (JP); Kazuo Kobayashi, Kakamigahara (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 435 days.

(21) Appl. No.: 11/132,227

(22) Filed: May 19, 2005

(65) Prior Publication Data
US 2005/0258719 A1 Nov. 24, 2005

(30) Foreign Application Priority Data
May 19, 2004 (JP) ............................. 2004-148970

(51) Int. Cl.
*B41J 2/045* (2006.01)
(52) U.S. Cl. ................. 310/365; 310/363; 310/364; 310/366; 347/68; 347/69; 347/70; 347/71; 347/72
(58) Field of Classification Search ......... 310/363–366; 347/68–72
See application file for complete search history.

(56) References Cited

U.S. PATENT DOCUMENTS

| | | | |
|---|---|---|---|
| 5,714,078 A | 2/1998 | Thiel et al. | |
| 6,073,321 A | 6/2000 | Kitahara et al. | |
| 6,347,862 B1 * | 2/2002 | Kanno et al. | 347/68 |
| 6,648,455 B2 * | 11/2003 | Takagi | 347/71 |
| 7,284,841 B2 * | 10/2007 | Imai et al. | 347/71 |
| 2003/0020787 A1 | 1/2003 | Nakamura et al. | |
| 2005/0030350 A1 | 2/2005 | Kobayashi et al. | |
| 2005/0248624 A1 * | 11/2005 | Nakamura et al. | 347/58 |
| 2006/0066684 A1 * | 3/2006 | Sugahara | 347/68 |
| 2006/0103268 A1 * | 5/2006 | Sugahara | 310/348 |
| 2006/0132550 A1 * | 6/2006 | Sugahara | 347/71 |

FOREIGN PATENT DOCUMENTS

| | | |
|---|---|---|
| EP | 0 782 923 A1 | 7/1997 |
| EP | 1 029 678 A2 | 8/2000 |
| JP | 11-314366 | 11/1999 |
| JP | 2000-15809 | 1/2000 |
| JP | 2003-154646 | 5/2003 |
| WO | WO 01/62499 | 8/2001 |
| WO | WO 02/26501 A1 | 4/2002 |

* cited by examiner

*Primary Examiner*—Jaydi A San Martin
(74) *Attorney, Agent, or Firm*—Banner & Witcoff, Ltd.

(57) ABSTRACT

A piezoelectric actuator 3 includes a metallic vibration plate 30, an insulating layer 31, a plurality of individual electrodes 32, a piezoelectric layer 33 and a common electrode 34. The insulating layer 31 is formed on the top surface of the vibration plate 30. The individual electrodes 32 are formed on the top surface of the insulating layer 31. The piezoelectric layer 33 is formed on the top surfaces of the individual electrodes 32. The common electrode 34 is formed on the top surface of the piezoelectric layer 33 over the individual electrodes 32. A plurality of terminals 36 and a plurality of wirings 35 are formed on the top surface of the insulating layer 31. Each of the terminals 36 is associated with one of the individual electrodes 32. Each of the wirings 35 connects one of the individual electrodes 32 and the associated terminal 36.

19 Claims, 13 Drawing Sheets

PIEZOELECTRIC ACTUATOR, INK-JET HEAD PROVIDED WITH THE SAME, INK-JET PRINTER, AND METHOD FOR MANUFACTURING PIEZOELECTRIC ACTUATOR

BACKGROUND OF THE INVENTION

1. Field of the Invention

The present invention relates to a piezoelectric actuator for use in an ink-jet head or the like, an ink-jet head provided with this piezoelectric actuator, an ink-jet printer, and a method for manufacturing a piezoelectric actuator.

2. Description of the Related Art

Piezoelectric actuators are conventionally known, which drive driven objects by deforming piezoelectrics. For example, this kind of piezoelectric actuator is employed in an ink-jet head such as the one described in Japanese Patent Application Laid-open No. 2003-154646. This piezoelectric actuator has a piezoelectric made of lead zirconate titanate (PZT), lower electrodes and upper electrodes. The lower electrodes are formed on the bottom surface of the piezoelectric, and each of them is associated with one of the pressure chambers in the ink-jet head. The upper electrodes are formed on the top surface of the piezoelectric, and each of them is associated with one of the lower electrodes. A wiring extends from each of the lower and upper electrodes and has an electric contact fitted on its one end. A driver IC (a drive unit) is connected to the electric contacts of the wirings for the lower and upper electrodes and supplies drive voltage to the piezoelectric actuator. When drive voltage is supplied to the piezoelectric actuator, the potential of the lower electrodes differs from that of the upper electrodes. This results in an electric field acting on the piezoelectric, which is sandwiched between the electrodes. The field action deforms the piezoelectric, thereby applying pressure on the ink in the pressure chambers.

However, in the piezoelectric actuator of Japanese Patent Application Laid-open No. 2003-154646, the electric contacts for the respective lower electrodes and the electric contacts for the respective upper electrodes are formed at different heights. Accordingly, it is difficult to directly connect the electric contacts, which are formed at different heights, and the output terminals of the driver IC. This makes it necessary to use a flexible wiring member, such as a flexible printed wiring board (or FPC: flexible printed circuit). However, such a wiring member is generally expensive.

In recent years, there have been needs for higher resolutions in print quality and more compact ink-jet heads. These needs may be met by dense arrangement of the electrodes and electric contacts of the piezoelectric actuator. However, the dense arrangement makes it necessary to use a wiring member having a narrower wiring pitch. Because such a wiring member is more expensive, the cost of manufacturing the piezoelectric actuator is higher.

The electric contacts positioned at different heights and the driver IC may be connected by one wiring member. In this case, the wiring member bends when the electric contacts, which are positioned at different heights, and the connecting terminals of the wiring member are connected. This may decrease the reliability of the electric connection. Alternatively, each of the electric contacts positioned at different heights and the driver IC may be connected by a wiring member. This increases the number of wiring members, thereby increasing the cost of electrically connecting the electric contacts and the driver IC.

SUMMARY OF THE INVENTION

An object of the present invention is to provide a piezoelectric actuator which ensures high reliability of the electric connection with a drive unit and reduces the cost of the electric connection.

Another object of the invention is to provide a method of manufacturing such a piezoelectric actuator.

Still another object of the invention is to provide an ink-jet head having such a piezoelectric actuator.

A further object of the invention is to provide an ink-jet printer provided with such an ink-jet head.

According to a first aspect of the present invention, there is provided a piezoelectric actuator comprising:

a metallic vibration plate;

an insulating layer formed on a surface of the vibration plate;

a plurality of individual electrodes formed on a surface of the insulating layer;

a piezoelectric layer formed on surfaces of the individual electrodes;

a common electrode formed on a surface of the piezoelectric layer and common to the individual electrodes;

a plurality of first terminals formed on the surface of the insulating layer and each associated with one of the individual electrodes; and a plurality of first wiring formed on the surface of the insulating layer and each electrically connecting one of the individual electrodes to one of the first terminals.

A first characteristic of the present invention is that the plurality of individual electrodes, the plurality of first terminals and the plurality of first wirings are formed on the surface of the insulating layer, which is formed on the vibration plate. Each of the first terminals is associated with one of the individual electrodes. Each of the first wirings electrically connects one of the individual electrodes to the associated first terminal. Thus, the individual electrodes, the first terminals therefor and the first wirings connecting these electrodes and terminals are formed on the same plane. This makes it possible to directly connect the individual electrodes and the first terminals, to which a drive unit for driving the piezoelectric actuator is connected, by the first wirings which are formed on the same plane as these electrodes and terminals, without using a costly wiring member such as an FPC. As a result, the cost of electric connection becomes lower, and the reliability of electric connection becomes higher.

A second characteristic of the present invention is that the common electrode, which is common to the individual electrodes, is arranged on the top surface of the piezoelectric layer. More specifically, an electrode is not formed for each of the individual electrodes to cooperate with it in generating an electric field across the piezoelectric layer, but the single common electrode, which is common to all or the groups of the individual electrodes, is formed on the piezoelectric layer. Accordingly, the number of terminals for connecting the common electrode to the drive unit or the like is very small in comparison with the terminals connecting the individual electrodes, which are formed on the insulating layer, to the drive unit or the like. For example, when the common electrode is formed over all of the individual electrodes, only one terminal is needed for the common electrode. Consequently, there is no need to use a wiring member to connect the common electrode, for which a fewer terminals are needed, to the drive unit or the like. The small number of terminals leads to easy and reliable electric connection. In addition, because the vibration plate is metallic and highly elastic, the piezoelectric actuator is highly responsive.

Even though pairs of the electrodes for applying electric fields to the piezoelectric layer are formed at different heights, the first and second characteristics eliminate the need for using an expensive wiring member such as an FPC to connect the terminals for the respective pairs of electrodes to the drive unit.

In the piezoelectric actuator of the present invention, the individual electrodes is arranged on the surface of the insulating layer, which electrically insulates adjoining individual electrodes from each other. Drive voltage is applied selectively to the individual electrodes. When the common electrode, arranged on the top surface of the piezoelectric layer, differs in potential from the individual electrodes to which the drive voltage is applied and which is arranged on the bottom surface of the piezoelectric layer. Then, the potential difference generates an electric field across the portion of the piezoelectric layer that is sandwiched between the common electrode and each of these individual electrodes. The electric field deforms the piezoelectric layer. The deformation of the piezoelectric layer deforms the vibration plate, there by driving a driven object.

In the piezoelectric actuator of the present invention, a second terminal which is associated with the common electrode and a second wiring which electrically connects the common electrode and the second terminal may be formed on the surface of the insulating layer. In such an actuator, the plurality of first terminals for the respective individual electrodes and the second terminal for the common electrode are formed on the surface of the insulating layer. Accordingly, all of the first and second terminals can be positioned at the same height. This makes it easy to join the output terminals of the drive unit which drives the piezoelectric actuator, and the first and second terminals. This also increases the reliability of the electric connection of the joined parts. When forming all of these terminals on the surface of the insulating layer, it is necessary to merely form the first and second wirings on this surface. This makes it possible to position the terminals at the same height with a simple wiring structure that does not require the use of a complex structure, such as through holes. In addition, the common electrode can be grounded.

In the piezoelectric actuator of the present invention, the insulating layer may be formed of a ceramic material. When the insulating layer is formed of a ceramic material, which has a high coefficient of elasticity, the actuator is more rigid and more responsive.

The piezoelectric actuator of the present invention may further include a drive unit which supplies drive voltage selectively to the individual electrodes, the drive unit being placed on the surface of the insulating layer, the drive unit having a plurality of output terminals joined to the first terminals and the second terminal. Accordingly, the individual electrodes and the common electrode are connected to the drive unit directly by the first and second wirings. This eliminates the need for a wiring member such as an FPC and reduces the cost of electric connection.

In the piezoelectric actuator of the present invention, the drive unit may further have an input terminal which is joined to a connecting terminal for electrically connecting the drive unit and a control unit which controls the drive unit. The connecting terminal may be formed on the surface of the insulating layer. In general, a drive unit is connected to a control unit for controlling it. According to the present invention, a connecting terminal which connects the control unit and the drive unit with an FPC, a flexible flat cable (FFC) or the like can be formed at one time when the plurality of individual electrodes, the plurality of terminals and the plurality of wirings are formed.

According to a second aspect of the present invention, there is provided an ink-jet head comprising:

the piezoelectric actuator of the present invention; and a channel unit having a plurality of pressure chambers and nozzles which discharge ink, the pressure chambers each communicating with one of the nozzles, the pressure chambers being open on a surface of the channel unit, and pressure chambers each being associated with one of the individual electrodes of the piezoelectric actuator;

wherein the vibration plate of the piezoelectric actuator is formed of any one of iron alloy, nickel alloy and aluminum alloy, and laid on the surface of a portion of the channel unit; and wherein at least the portion of the channel unit on which the vibration plate is laid is formed of any one of iron alloy, nickel alloy and aluminum alloy.

In the ink-jet head of the present invention, because at least a part of the channel unit of the ink-jet head is formed of any one of iron alloy, nickel alloy and aluminum alloy, it is easy to form ink channels in the channel unit by etching or the like. In addition, because the vibration plate is formed of similar material, the channel unit and the vibration plate have similar coefficients of thermal expansion, which improve their joining strength.

In the ink-jet head of the present invention, the vibration plate may be formed of a same material as that of at least the portion of the channel unit on which the vibration plate is laid. Accordingly, the vibration plate and this portion of the channel unit have more similar coefficients of thermal expansion, so that their joining strength is further increased. The ink in the channel unit is in contact with the channel unit and the vibration plate that are formed of the same kind of material. As a result, no local cell is formed regardless of the selection of ink type. Thus, there are no restrictions on ink selections with regard to corrosion, so a user has greater freedom to select the ink to use.

In the ink-jet head of the present invention, the vibration plate and at least the portion of the channel unit on which the vibration plate is laid may be formed of stainless steel. This improves the corrosion resistance of both the vibration plate and this portion of the channel unit against ink, so a user has still greater freedom to select the ink to use.

According to a third aspect of the present invention, there is provided a method of manufacturing a piezoelectric actuator, the method comprising:

a first step of forming an insulating layer on a surface of a metallic vibration plate;

a second step of forming a plurality of individual electrodes, first terminals and first wirings on a surface of the insulating layer, the first terminals each being associated with one of the individual electrodes, the first wirings each electrically connecting one of the individual electrodes and one of the first terminals;

a third step of forming a piezoelectric layer on surfaces of the individual electrodes; and a fourth step of forming a common electrode on a surface of the piezoelectric layer over the individual electrodes.

According to this method, it is possible to easily manufacture a piezoelectric actuator with which effects can be achieved which are similar to those of the first aspect of the present invention. In addition, in the second step, the individual electrodes, the first terminals and the first wirings can be formed at a time on the surface of the insulating layer. This makes it possible to shorten the manufacturing process.

In the method of the present invention, the fourth step may include forming a second terminal and a second wiring together with the common electrode on the surface of the insulating layer, the second terminal being associated with the common electrode, the second wiring electrically connecting the common electrode and the second terminal. Accordingly, it is possible to easily manufacture the above-described piezoelectric actuator. In addition, in the fourth step, the common electrode and the second terminal and the second wiring corresponding to the common electrode, respectively, can be formed at a time on the surface of the insulating layer. This makes it possible to shorten the manufacturing process.

The method of the present invention may further comprise a fifth step of:

placing, on the surface of the insulating layer, a drive unit which supplies drive voltage selectively to the individual electrodes, and has output terminals; and joining the output terminals to the first terminals and the second terminal. In this case, the individual electrodes and the drive unit can be connected directly with the first and second wirings. This eliminates the need for a wiring member such as an FPC and reduces the cost of electric connection.

In the first step, the insulating layer may be formed on the surface of the vibration plate by an aerosol deposition method. With this method, it is possible to form a film having a sufficient insulation property with a thickness of not more than 5 μm. In particular, it is possible to form a film which is excellent in insulation property even with a thickness of not more than 2 μm.

In the method of the present invention, the second step may also include forming, on the surface of the insulating layer, a connecting terminal which electrically connects the drive unit and a control unit which controls the drive unit, the connecting terminal being jointed to an input terminal of the drive unit. Accordingly, the connecting terminal for connecting the control unit and the drive unit can be formed at the same time that the individual electrodes, the first terminals and the first wirings are formed.

According to a fourth aspect of the present invention, there is provided a piezoelectric actuator which comprises:

a piezoelectric layer;

a vibration plate provided on one surface of the piezoelectric layer;

a plurality of individual electrodes interposed between the piezoelectric layer and the vibration plate;

a common electrode provided on the other surface of the piezoelectric layer and common to the individual electrodes;

a plurality of first terminals formed on a same plane as the individual electrodes and each associated with one of the individual electrodes; and a plurality of first wirings formed on the same plane as the individual electrodes and each electrically connecting one of the individual electrodes and one of the first terminals. In this actuator, the plurality of individual electrodes are arranged between the piezoelectric layer and the vibration plate. Accordingly, it is possible to arrange the first terminals and the first wirings for the individual electrodes on the same plane with the individual electrodes. In addition, the common electrode is common for the plurality of individual electrodes, the number of the wirings and terminals for the electrodes can be small. By adopting such a specific arrangement for positioning the individual electrodes and by using such a common electrode, it is possible to arrange a drive unit which applies a driving voltage to the individual electrodes on the actuator, without using a wiring member such as FPC.

The vibration plate may be formed of a metallic material, and an insulating layer may be formed on the vibration plate. Alternatively, the vibration plate may be formed of an insulating material.

A second terminal associated with the common electrodes and a second wiring electrically connecting the common electrode and the second terminal may be formed on a same plane as the plurality of individual electrodes. In particular, a structure may be adopted in which the plurality of individual electrodes, the first terminals, the first wirings, the second terminal, and the second wiring are formed on a surface of the insulating layer; and in which a drive unit which supplies a drive voltage selectively to the individual electrodes is provided on the surface of the insulating layer, the drive unit having a plurality of output terminals joined to the first terminals and the second terminal. This structure may be an alternative to a wiring structure using a conventional wiring member such as FPC.

According to the present invention, there is provided an ink-jet head comprising:

the piezoelectric actuator according to the fourth aspect of the present invention; and a channel unit having a plurality of pressure chambers and nozzles which discharge ink, the pressure chambers each communicating with one of the nozzles, the pressure chambers being open on a surface of the channel unit, the pressure chambers each being associated with one of the individual electrodes of the piezoelectric actuator.

DESCRIPTION OF THE PREFERRED EMBODIMENTS

First Embodiment

The following is a description of an embodiment of the present invention. The embodiment is an example of the present invention as it is applied to a piezoelectric actuator for use in an ink-jet head.

Figure 1:
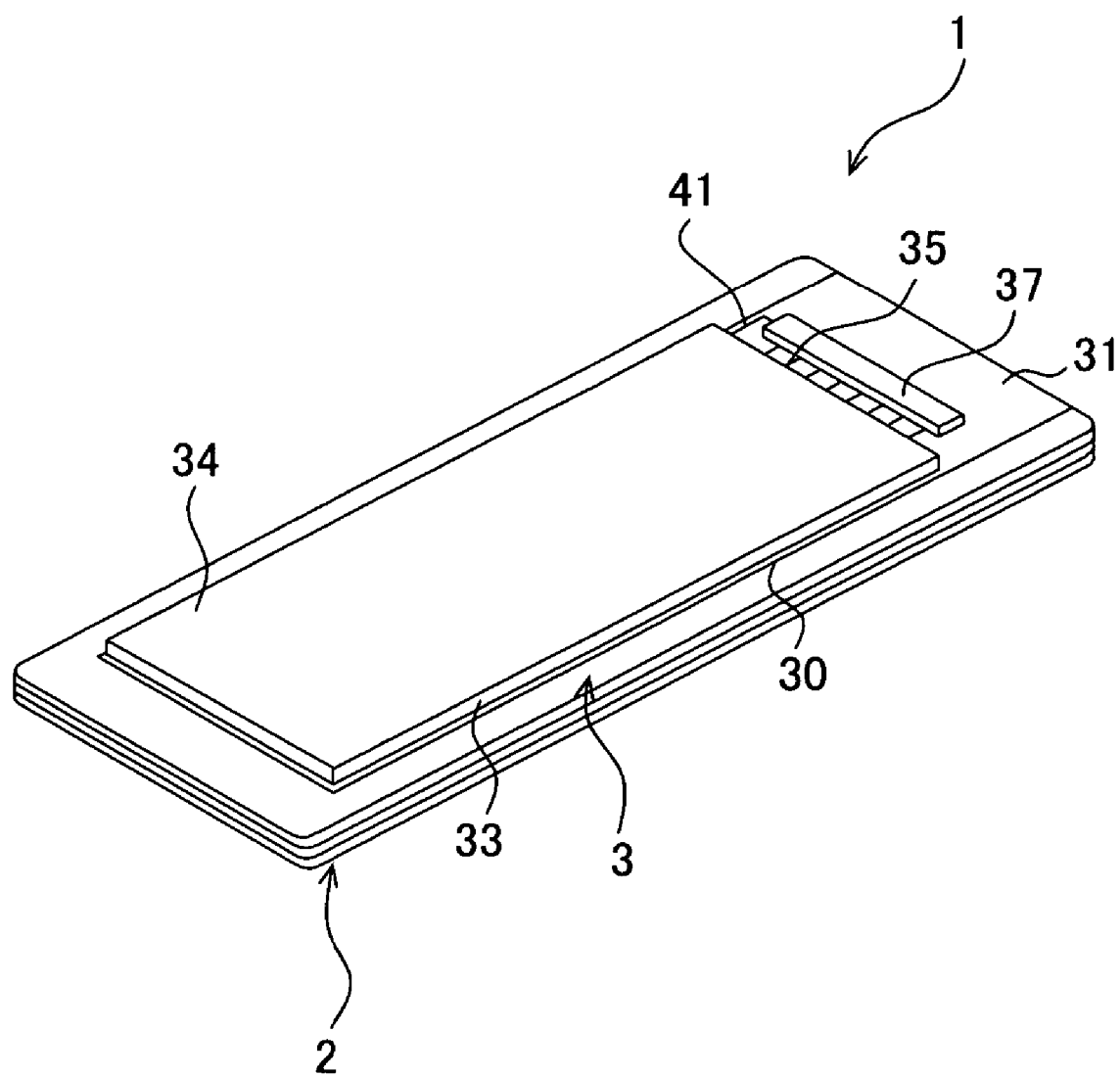
FIG. 1 is a perspective view of an ink-jet head according to an embodiment of the present invention.

As is shown in FIG. 1, an ink-jet head 1 includes a channel unit 2 and a piezoelectric actuator 3. The channel unit 2 has ink channels formed therein. The piezoelectric actuator 3 is laminated to or stacked on the top surface of the channel unit 2.

Figure 2:
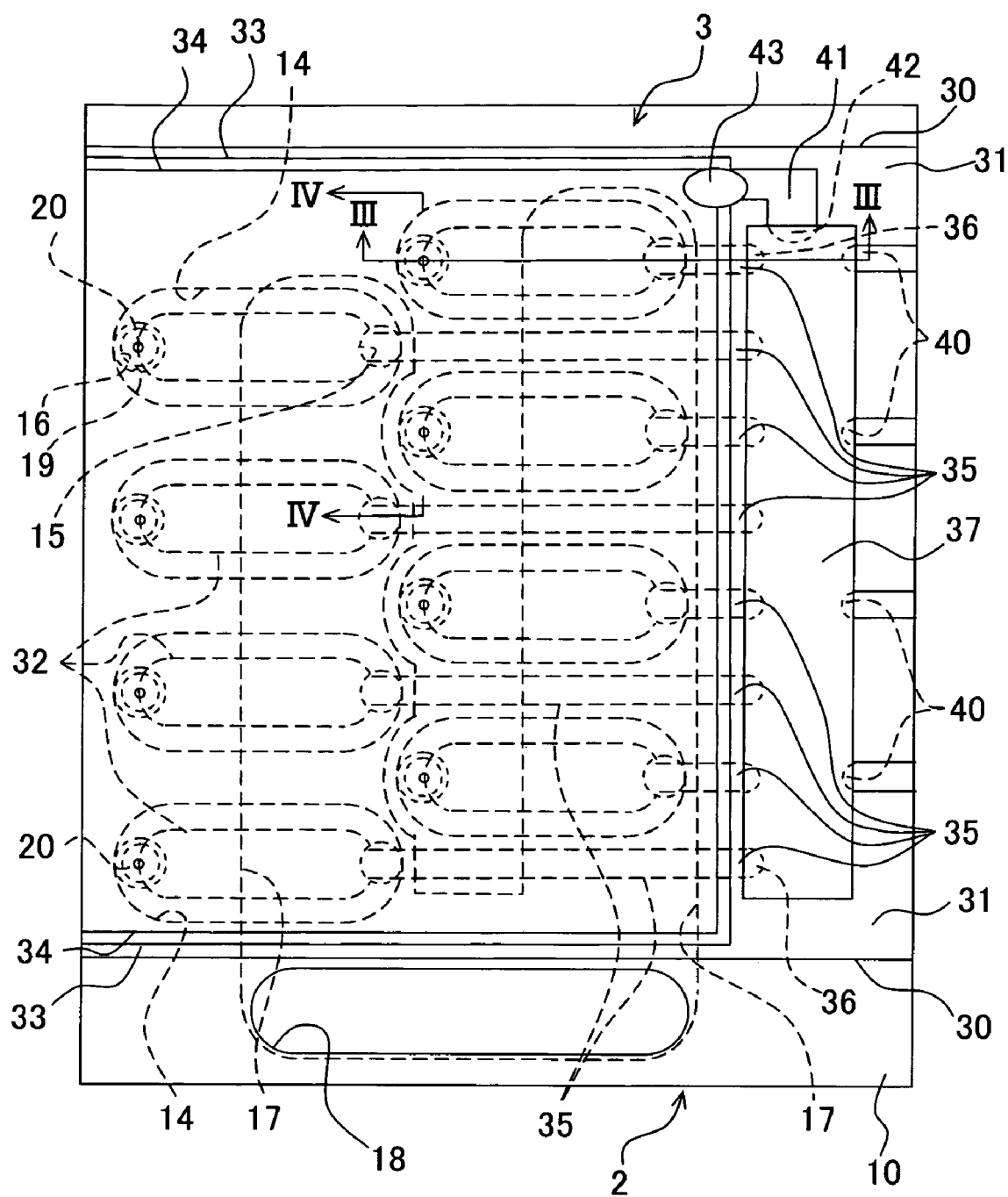
FIG. 2 is a schematic plan view of the right half of the ink-jet head shown in FIG. 1.
Figure 3:
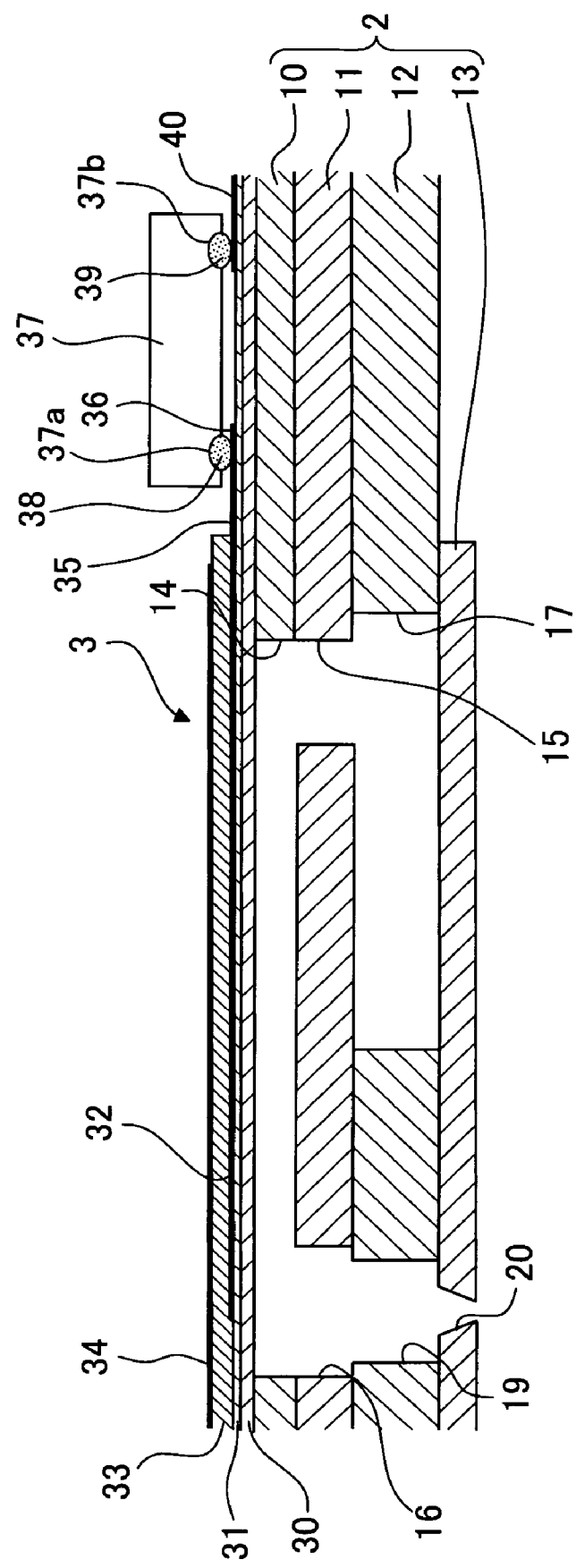
FIG. 3 is a sectional view taken on the line III-III of FIG. 2.
Figure 4:
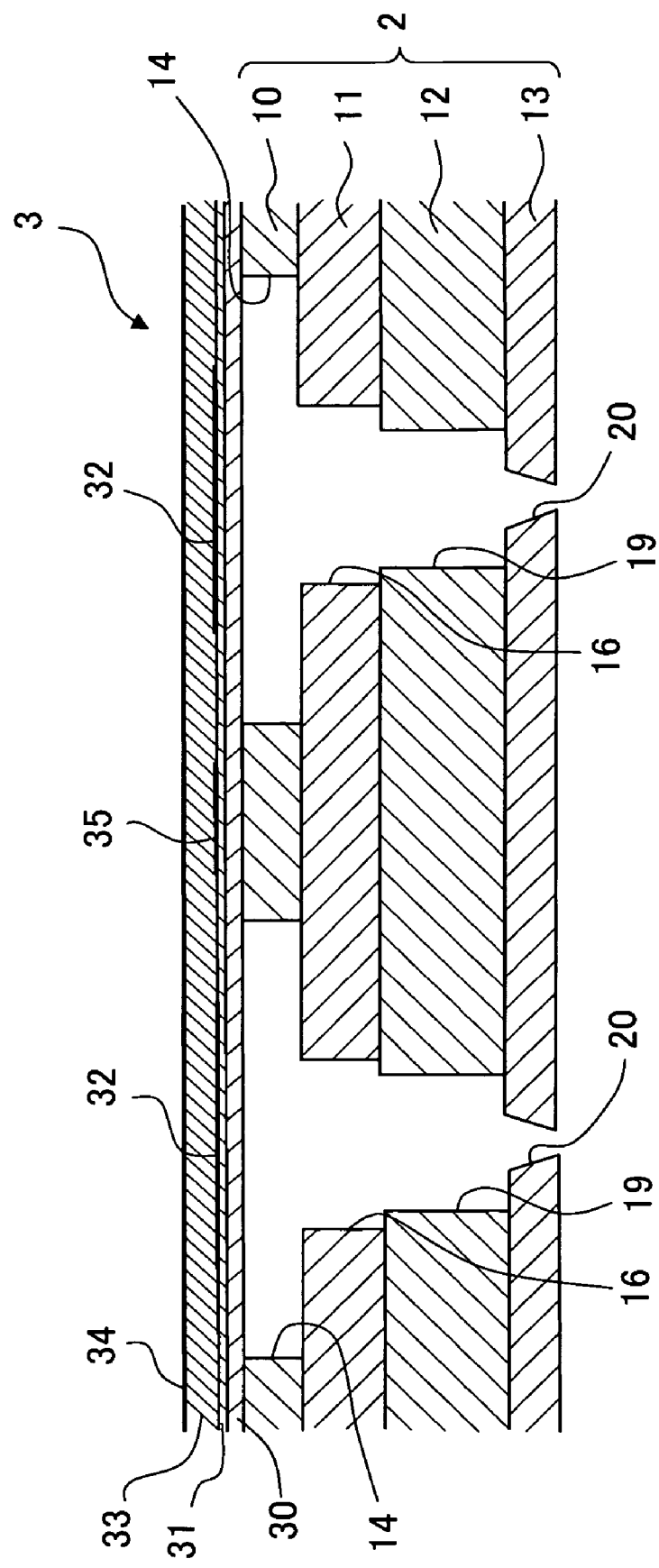
FIG. 4 is a sectional view of the line IV-IV of FIG. 2.

The channel unit 2 will be described below. As is shown in FIGS. 2 to 4, the channel unit 2 includes a cavity plate 10, a base plate 11, a manifold plate 12, and a nozzle plate 13. These four plates 10 through 13 are joined together in stacked layers. The cavity plate 10, the base plate 11, and the manifold plate 12 are substantially rectangular and made of stainless steel. For that reason, it is easy to form ink channels, such as a manifold 17 and pressure chambers 14, which will be described later on, in the three plates 10 through 12 using an etching process. The nozzle plate 13 may be formed of high molecular synthetic resin (such as polyimide) and is joined to the bottom surface of the manifold plate 12. Alternatively, the nozzle plate 13 may be formed of metallic material, such as stainless steel, like that used for the three plates 10 through 12.

As is shown in FIG. 2, the cavity plate 10 has a plurality of pressure chambers 14 formed through it, which are arranged along a plane. The pressure chambers 14 are open on the top surface of the channel unit 2 (the top surface of the cavity plate 10, to which a vibration plate 30, described later on, is joined). FIG. 2 shows a part (eight) of the pressure chambers 14. Each of the pressure chambers 14 is substantially elliptic in a plan view and is arranged so that the long axis direction thereof is parallel to the longitudinal direction of the cavity plate 10.

The base plate 11 has communicating holes 15 and 16 formed through it for each of the pressure chambers 14. Each of the communicating holes 15 is formed at a position which overlaps in a plan view with one end of the associated chamber 14 in the long axis direction thereof. Each of the communicating holes 16 is formed at a position which overlaps in a plan view with the other end of the associated chamber 14 in the long axis direction thereof. The manifold plate 12 has a manifold 17 formed through it. Portions of the manifold 17 extend in two rows in the lateral direction of the manifold plate 12 (vertical direction in FIG. 2). The manifold 17 overlaps in a plan view with the right halves in FIG. 2 of the pressure chambers 14. The cavity plate 10 has an ink supply port 18 formed through it, through which ink is supplied from an ink tank (not shown) to the manifold 17. The manifold plate 12 also has communicating holes 19 formed through it, each of which is formed at a position which overlaps in a plan view with the left end in FIG. 2 of one of the pressure chambers 14. The nozzle plate 13 has a plurality of nozzles 20 formed through it, each of which is formed at a position which overlaps in a plan view with the left end of one of the pressure chambers 14. The nozzles 20 are formed by processing a substrate of high molecular synthetic resin, such as polyimide, with an excimer laser.

As shown in FIG. 3, the manifold 17 communicates with the pressure chambers 14 via the communicating holes 15, and the pressure chambers 14 communicate with the nozzles 20 via the communicating holes 16 and 19. Thus, the channel unit 2 has individual ink channels formed therein and leading from the manifold 17 through the pressure chambers 14 and to the nozzles 20 respectively.

The piezoelectric actuator 3 will be described below. As shown in FIGS. 1 to 4, the piezoelectric actuator 3 includes a vibration plate 30, an insulating layer 31, individual electrodes 32, a piezoelectric layer 33, and a common electrode 34. The vibration plate 30 is arranged on the top surface of the channel unit 2. The insulating layer 31 is formed on the top surface of the vibration plate 30. The individual electrodes 32 are formed on the top surface of the insulating layer 31, and each of the individual electrodes 32 is associated with one of the pressure chambers 14. The piezoelectric layer 33 is formed on the top surfaces of the individual electrodes 32. The common electrode 34 is formed on the top surface of the piezoelectric layer 33 over the individual electrodes 32 and is common to the individual electrodes (in case of this embodiment, the common electrode 34 is common to all of the individual electrodes 32).

The vibration plate 30 is a stainless steel plate that is substantially rectangular in a plan view. The vibration plate 30 covers the openings of the pressure chambers 14 and is joined in a laminated state to the top surface of the cavity plate 10. Because the vibration plate 30 is formed of stainless steel, which has a comparatively high coefficient of elasticity, the rigidity of the vibration plate 30 makes the piezoelectric actuator 3 highly responsive when the piezoelectric layer 33 is deformed to discharge ink, as described later on. The vibration plate 30 is joined to the top surface of the cavity plate 10, which is also formed of stainless steel. For that reason, the vibration plate 30 and cavity plate 10 have equal coefficients of thermal expansion, which improve the strength of their joint. The ink in the channel unit 2 is in contact with the vibration plate 30 and the channel unit 2, which are formed of stainless steel. Because stainless steel is highly resistant to ink corrosion, there is no possibility that local cells are formed in the channel unit 2 or the vibration plate 30, regardless of the selection of ink type. Thus, there are no restrictions on ink selections with regard to corrosion, so a user has greater freedom to select the ink to use.

The insulating layer 31 is formed on the top surface of the vibration plate 30 and is formed of alumina, zirconia, silicon nitride or other ceramic material having a high coefficient of elasticity. The surface of the insulating layer 31 is flat. Because the insulating layer 31 is formed of ceramic material, which has a high coefficient of elasticity, the actuator is more rigid and more responsive. Because the insulating layer 31 is formed on the top surface of the vibration plate 30, the individual electrodes 32 can be formed on the vibration plate 30, even though the vibration plate 30 is formed of stainless steel, which is an appropriate material, as described above, not an insulating material. In this application, the "insulating material" represents material that is intentionally used to inhibit the electric conduction among the individual electrodes 32, and the "insulating layer" represents a layer formed of such material. Accordingly, for example, the "insulating layer" does not include a layer formed mainly of lead zirconate titanate (PZT), of which the piezoelectric layer 33 is formed.

The individual electrodes 32 are formed on the top surface of the insulating layer 31. The individual electrodes 32 are flat, elliptic and smaller than the pressure chambers 14 to a certain extent. The individual electrodes 32 are formed at positions which overlap in a plan view with the central areas of the respective pressure chambers 14. The individual electrodes 32 are made of conductive material such as gold. Adjoining individual electrodes 32 are insulated electrically from each other by the insulating layer 31.

A wiring 35 (a first wiring) extends from one end (the right end in FIG. 2) of each of the individual electrodes 32 in parallel with the long axis direction thereof on the top surface of the insulating layer 31. The wiring 35 has a terminal 36 (a first terminal) formed on its other end. All the terminals 36 for the individual electrodes 32 are positioned at the same height. A driver IC 37 (a drive unit) is positioned at the top surface of the insulating layer 31 and selectively supplies drive voltage to the individual electrodes 32. The driver IC 37 has output terminal 37*a*, each of which is joined to one of the terminals 36 for the respective electrodes 32 via a bump 38 composed of conductive soldering material such as solder. In this way, it is possible to connect the individual electrodes 32 and the driver IC 37 directly by the wirings 35, which are formed on the same plane as these electrodes, without using a costly wiring member such as an FPC. This reduces the cost of electric connection and improves the reliability of the connection.

The driver IC 37 also has input terminals 37b. Connecting terminals 40 are formed on the insulating layer 31. Each of the connecting terminals 40 is connected to one of the input terminal 37b of the driver IC 37 via a bump 39 formed of solder or the like. This makes it easy to connect the driver IC 37 and a control unit (not shown) for the driver IC 37 via the connecting terminals 40.

The piezoelectric layer 33 is formed on the top surfaces of the individual electrodes 32 and is formed mainly of lead zirconate titanate (PZT), which is a solid solution of lead titanate and lead zirconate, and which is a ferroelectric substance. The piezoelectric layer 33 is formed as a continuous layer as to cover the entire surfaces of the individual electrodes 32. The common electrode 34 is formed on the entire top surface of the piezoelectric layer 33 and is common to the individual electrodes 32. As is shown in FIG. 2, a wiring 41 (a second wiring) extends from the common electrode 34 and over the top surfaces of the piezoelectric layer 33 and insulating layer 31. The wiring 41 has a terminal 42 (a second terminal) formed on its other end, which is in contact with a terminal (not shown) of the driver IC 37. This results in the common electrode 34 being grounded via the wiring 41 and the driver IC 37 to be kept at ground potential. The common electrode 34 is also made of conductive material such as gold. The terminal 42 is positioned at the same height as the terminals 36.

As is shown in FIG. 3, the common electrode 34 and the output terminals of the driver IC 37 are positioned at different heights because the common electrode 34 is formed on the top surface of the piezoelectric 33. By contrast, the individual electrodes 32 are connected to the driver IC 37 by the wirings 35, which are formed on the same plane as the individual electrodes. As compared with the individual electrodes 32, the electric connection of the common electrode 34 and driver IC 37 is conceivably difficult to some extent. However, because the common electrode 34 is formed to correspond to all of the individual electrodes 32 and common to them, the common electrode 34 can be connected to the driver IC 37 by only one wiring 41. This eliminates the need for using a wiring member such as an FPC to connect the common electrode 34 to the driver IC 37. Because there is only one terminal for the common electrode 34, this electrode can be electrically connected easily by a conductive paste or the like, and the connection is highly reliable.

Because the terminals 36 for the individual electrodes 32 and the terminal 42 for the common electrode 34 are formed on the top surface of the insulating layer 31, all of these terminals 36 and 42 can be positioned at the same height. This makes it is easy to join these terminals 36 and 42 and the output terminals of the driver IC 37, and increases the reliability of the electric connection of the joined terminals. When forming all of the terminals 36 and terminal 42 on the top surface of the insulating layer 31, it is necessary to merely form the plurality of wirings 35 and one piece of the wiring 41 on the surface of the insulating layer 31. This makes it possible to position the terminals 36 and 42 at the same height with a simple wiring structure that does not require the use of a complex structure, such as through holes.

The wiring 41 extents over a surface having a level difference which is equivalent to the thickness of the piezoelectric layer 33. Therefore, it is considered that the wiring 41 is lower in structural reliability than the wirings 35, which extend on a flat surface. However, as described above, only one wiring 41, which is relatively unreliable, is enough, and the other wirings 35 are high in structural reliability. This results in an overall reliable wiring structure. If the wiring 41 is formed at one time from the common electrode 34 to the insulating layer 31, its portion at the level difference is thinner. Therefore, as shown in FIG. 2, this portion is provided with a reinforcing part 43 for enhancing its reliability.

The action of the piezoelectric actuator 3 during ink discharge will be described below. The driver IC 37 supplies drive voltage selectively to individual electrodes 32, which are connected there to via the respective wirings 35. As a result, the potential of the individual electrodes 32 on the bottom side of the piezoelectric layer 33 to which drive voltage is applied differs from that of the common electrode 34 on the top side of the piezoelectric 33, which is kept at ground potential. The potential difference generates an electric field vertically across the piezoelectric layer 33 between the individual electrodes 32 and the common electrode 34. The electric field causes the portions of the piezoelectric layer 33 which are disposed directly above these individual electrodes 32 to contract in a horizontal direction. The horizontal direction is perpendicular to the vertical direction in which the piezoelectric layer 33 is polarized. The insulating layer 31 and the vibration plate 30, which are positioned on the bottom side of the piezoelectric layer 33, are fixed to the cavity plate 10. Therefore, the horizontal contraction causes the portions of the piezoelectric layer 33 that are sandwiched between these individual electrodes 32 and the common electrode 34 to deform so as to project toward the respectively associated pressure chambers 14. The partial deformation of the piezoelectric layer 33 causes the portions of the vibration plate 30 that cover these pressure chambers 14 to deform so as to project toward the pressure chambers. This reduces the volume of these pressure chambers 14, thereby increasing the pressure on the ink inside. The increased pressure discharges ink from the nozzles 20 communicating with these pressure chambers 14.

Figure 5:
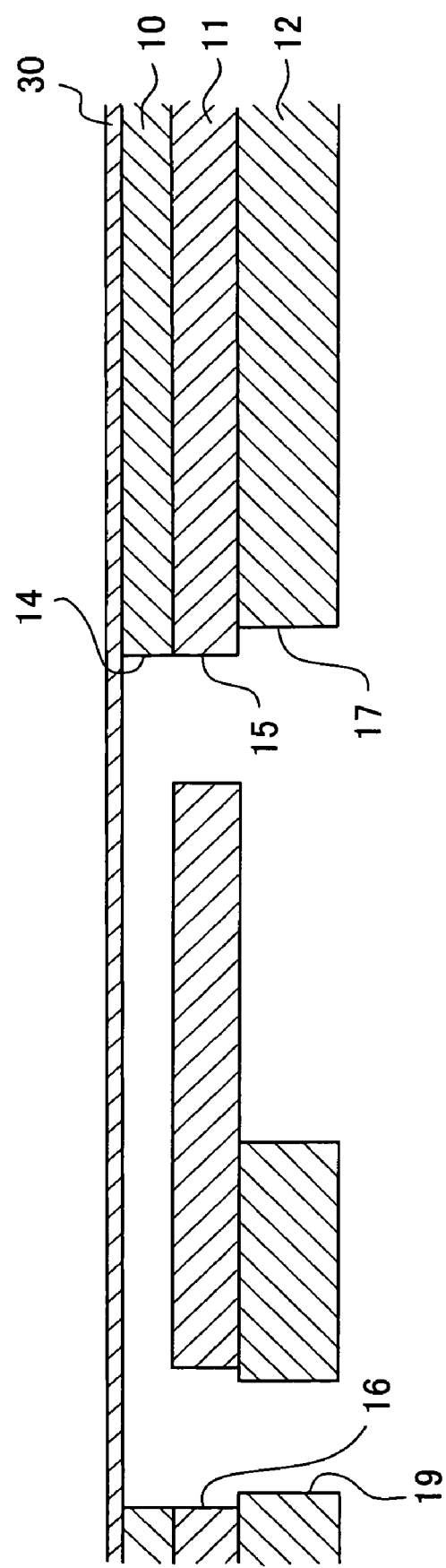
FIG. 5 is a view showing a step of joining a channel unit and a vibration plate.

A method of manufacturing the piezoelectric actuator 3 will be described below. First, as is shown in FIG. 5, the three plates 10 to 12 of stainless steel and the vibration plate 30 of stainless steel are joined together by diffused junction or the like. The cavity plate 10 and the vibration plate 30 are both made of the same stainless steel, so they have equal coefficients of thermal expansion. Accordingly, there is little residual stress between the joint surfaces of the cavity plate 10 and vibration plate 30, and thus their joining strength is extremely high.

Figure 6:
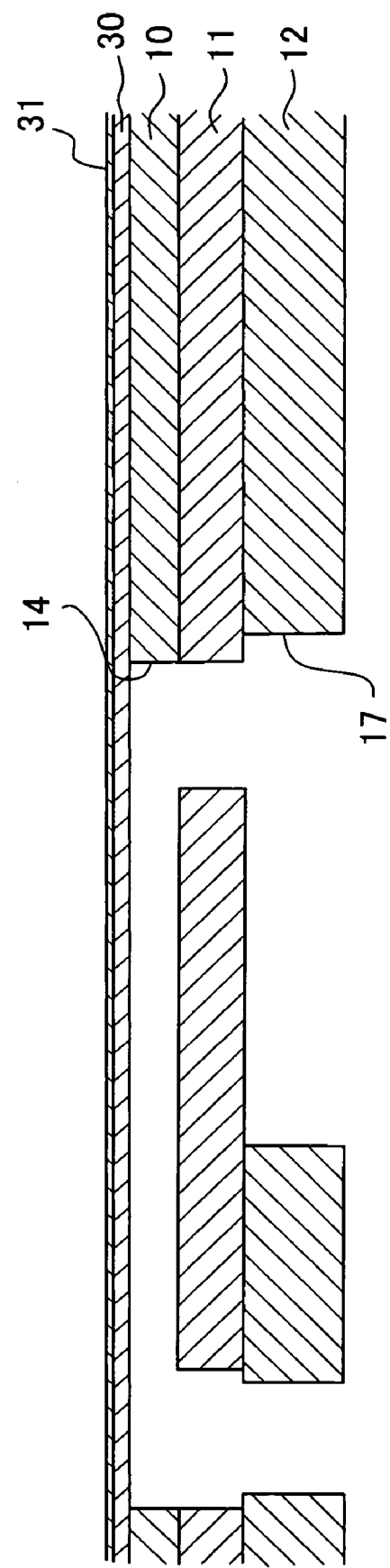
FIG. 6 is a view showing a step (first step) of forming an insulating layer.

Next, as is shown in FIG. 6, the insulating layer 31 is formed of alumina, zirconia, or ceramic material such as silicon nitride on the top surface of the vibration plate 30 (the first step). The insulating layer 31 may be formed by an aerosol deposition method for depositing ultra-fine particulate material by colliding it onto the surface of the vibration plate at high speed. This method makes it possible to form a very thin layer that is highly insulative even if its thickness is not more than 5 μm and, in particular, not more than 2 μm. The insulating layer 31 may also be formed by a sol-gel method or a sputtering method.

Figure 7:
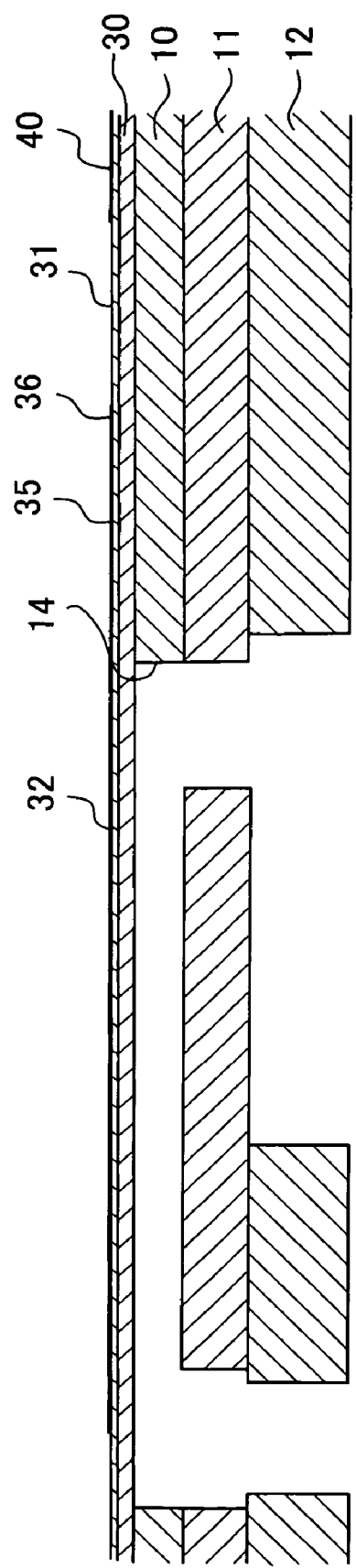
FIG. 7 is a view showing a step (second step) of forming individual electrodes.

Next, as shown in FIG. 7, the individual electrodes 32, the wirings 35, the terminals 36 and the connecting terminals 40 are formed on the top surface of the insulating layer 31 (the second step). The individual electrodes 32, the wirings 35, the terminals 36 and the connecting terminals 40 may be formed at one time by patterning the top surface of the insulating layer 31 by screen-printing a conductive paste on this surface.

Alternatively, the top surface of the insulating layer 31 may be patterned with individual electrodes 32, wirings 35, terminals 36 and connecting terminals 40 by forming a conductive layer on the entire surface of the insulating layer 31 by a plating method, a sputtering method, a vapor deposition method or another method, and then partially removing the conductive layer by laser processing, a masking and resist method or another method.

Figure 8:
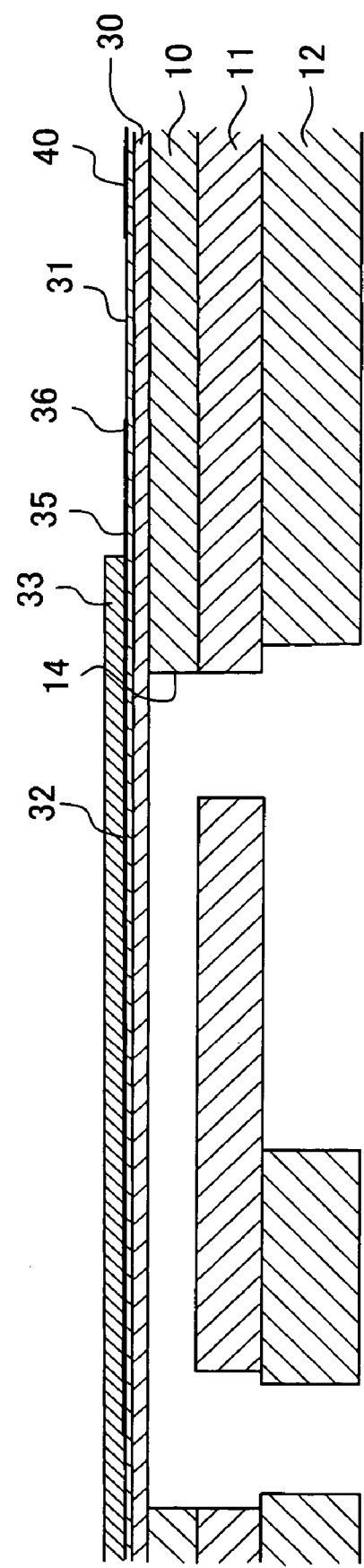
FIG. 8 is a view showing a step (third step) of forming a piezoelectric layer.
Figure 9:
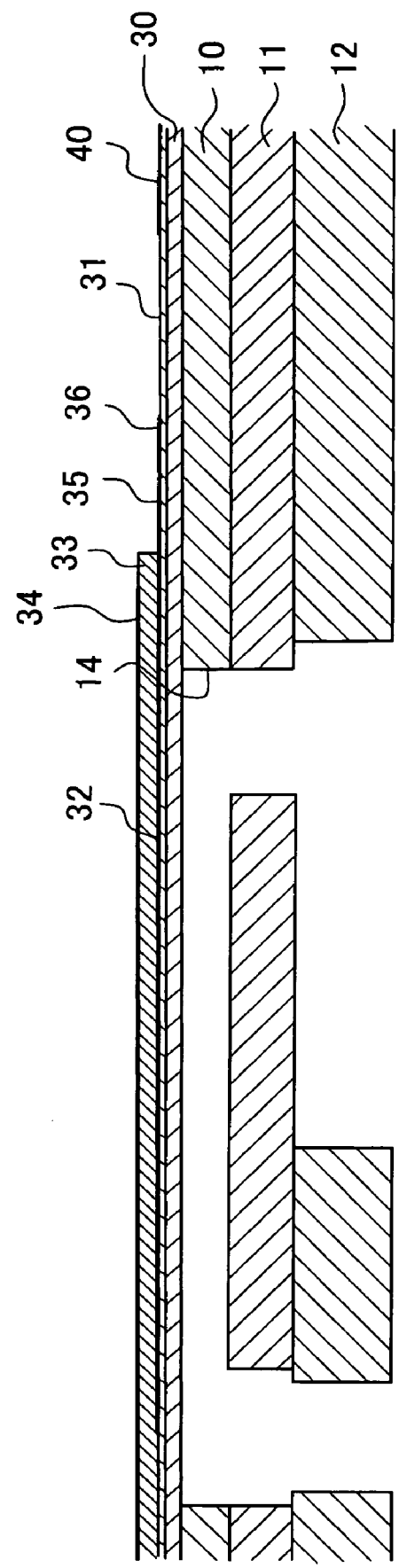
FIG. 9 is a view showing a step (fourth step) of forming a common electrode.

Next, as shown in FIG. 8, the piezoelectric layer 33 formed of PZT is formed on the top surface of the individual electrodes 32 by an aerosol deposition method, a sol-gel method, a sputtering method or another method (the third step). Subsequently, the piezoelectric layer 33 is heat-treated at a temperature of approximately 600° C. so that the structure of the piezoelectric layer 33 is fine. Then, as shown in FIG. 9, the common electrode 34, the wiring 41 and the terminal 42 are formed on the entire top surface of the piezoelectric layer 33 by screen printing, a vapor deposition method, a sputtering method or another method (the fourth step).

Figure 10:
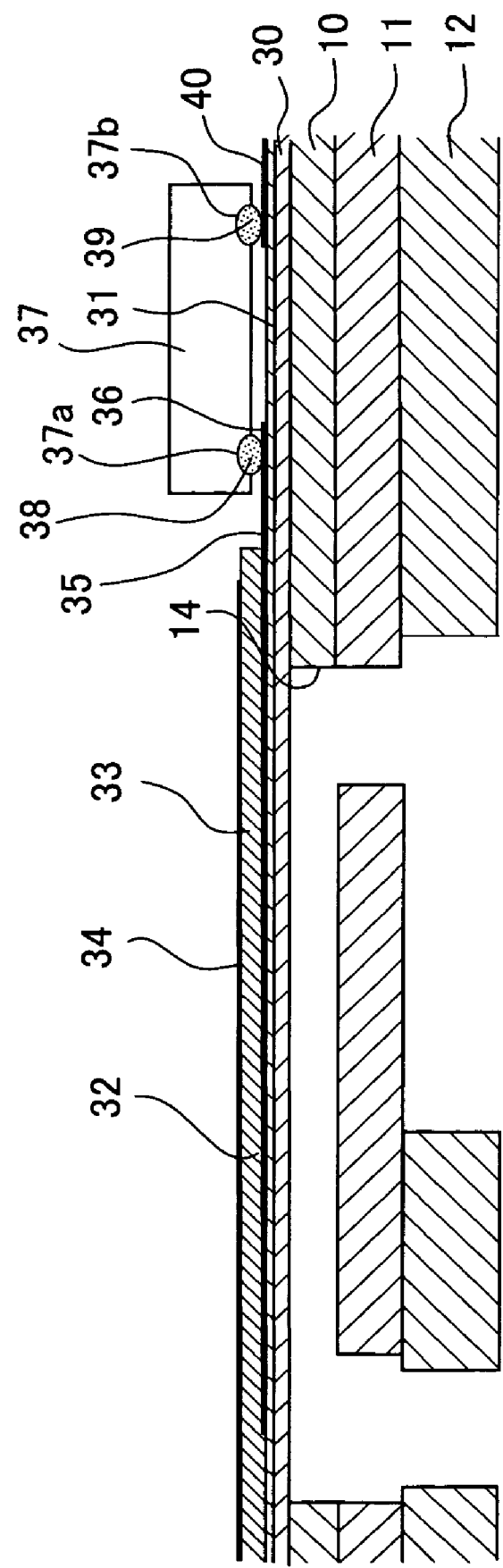
FIG. 10 is a view showing a step (fifth step) of placing a driver IC over the insulating layer.
Figure 11:
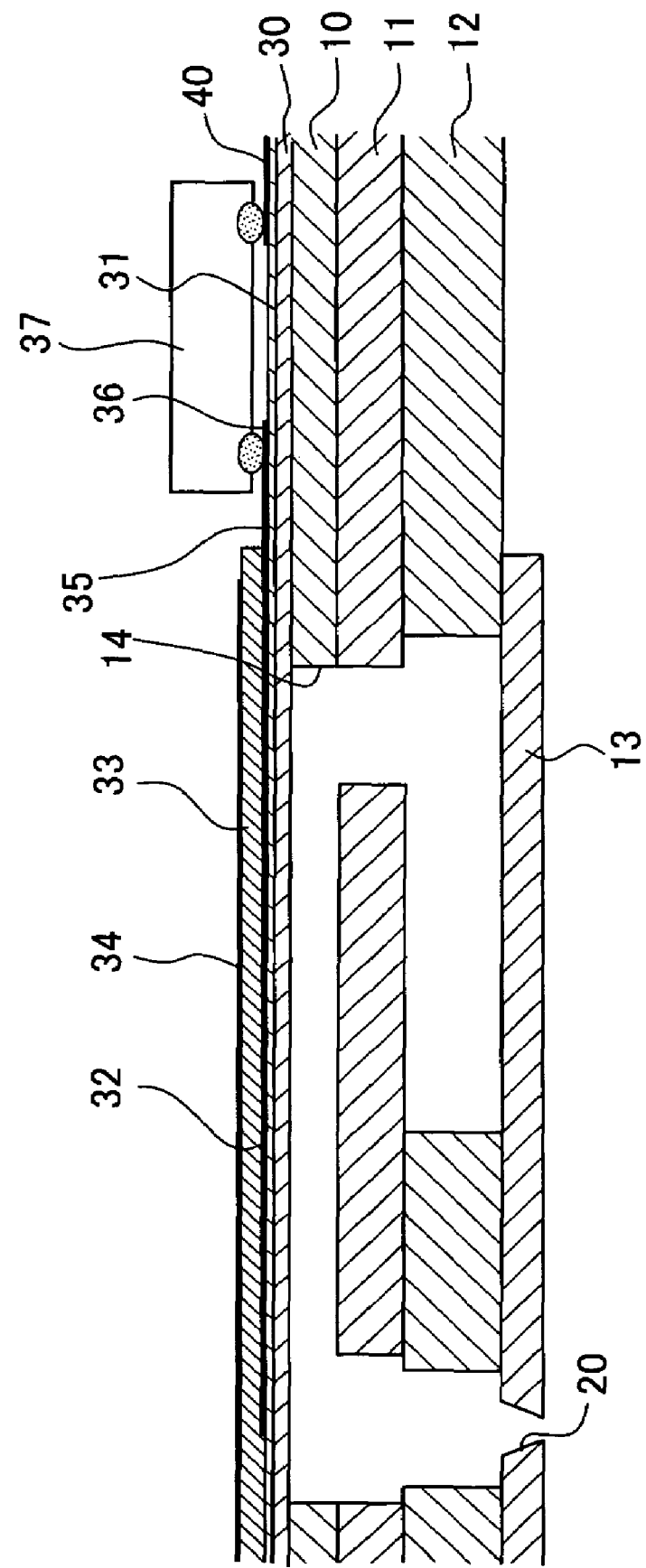
FIG. 11 is a view showing a step of joining a nozzle plate.

Then, as is shown in FIG. 10, the driver IC 37 is placed on the insulating layer 31. The output terminals 37a of the IC 37 are joined to the terminals 36 and 42 via the bumps 38. The input terminals 37b of the IC 37 are joined to the connecting terminals 40 via the bumps 39 (the fifth step). Finally, as is shown in FIG. 11, the nozzle plate 13 is joined to the bottom surface of the manifold plate 12.

The nozzle plate 13 may be made of metallic material such as stainless steel. In this case, the channel unit 2 may be formed in advance by joining the nozzle plate 13 to the other three plates at the same time. Thereafter, the vibration plate 30, the individual electrodes 32 and the piezoelectric layer 33 may be laminated in order to the top surface of the channel unit 2. Then, the piezoelectric layer 33 may be heat-treated.

The individual electrodes 32, the plurality of terminals 36 for the respective electrodes 32, and the plurality of wirings 35, each of which connects the associated electrode 32 and terminal 36, are formed on the top surface of the insulating layer 31. The driver IC 37, which is joined to the terminals 36, is placed over the insulating layer 31. This makes it possible to connect the individual electrodes 32 and the driver IC 37 directly without having to use a costly wiring member such as an FPC. Consequently, the electric connection is more reliable. When forming the individual electrodes 32 on the insulating layer 31 (the second step), it is possible to form the individual electrodes 32, the terminals 36, the wirings 35 and the connecting terminals 40 at one time. This contributes to a shortened manufacturing process.

When forming the common electrode 34 on the top surface of the piezoelectric layer 33 (the fourth process), it is possible to form this electrode 34, the wiring 41 and the terminal 42 at one time. This also contributes to a shortened manufacturing process.

Because the common electrode 34 is formed to be common to all of the individual electrodes 32, only one wiring 41 is required to connect the common electrode 34 to the driver IC 37. Thus, there is no need to use a wiring member to connect the common electrode 34 to the driver IC 37. Because there is only one terminal for the common electrode 34, it is easy to connect this electrode electrically, and the reliability of the connection is high.

Second Embodiment

In the first embodiment, the vibration plate 30 formed of stainless steel is used, and the insulating layer 31 of ceramic material is provided on the top surface of the vibration plate 30. Alternatively, the vibration plate 30 may be formed of insulating material so that the insulating layer 31 can be omitted. In this case, the vibration plate 30 may be formed of alumina, zirconia, silicon nitride or other ceramic material so that the piezoelectric actuator can be manufactured at low cost. In this case, both of the cavity plate 10 and vibration plate 30 may be formed of a same material such as, for example, alumina so that their coefficients of thermal expansion are matched. The pressure chambers 14 may be formed by etching the alumina material of the whole channel unit 2 including the vibration plate 30. The second embodiment is same as the first embodiment except that the vibration plate is changed and the insulating layer is omitted.

Third Embodiment

Figure 12:
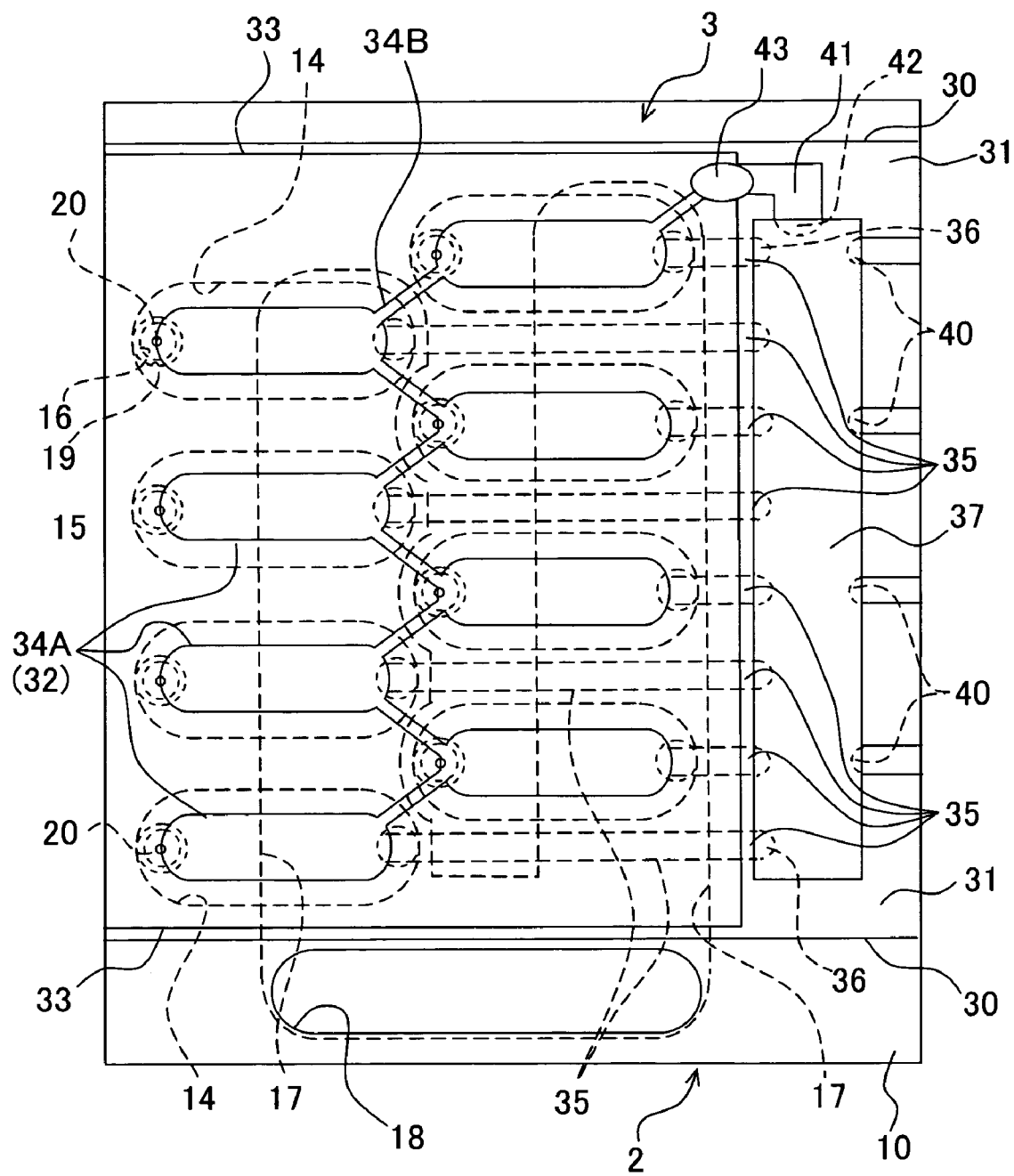
FIG. 12 is a view showing the pattern of common electrode in a second embodiment of the present invention.

In each of the foregoing embodiments, the common electrode 34 is formed on the piezoelectric layer 33 as a rectangular region covering not only areas associated with the individual electrodes 32 but also the spaces between these areas. However, the common electrode 34 may make any other pattern as far as the common electrode is common to the individual electrodes 32. For example, as shown in FIG. 12, the common electrode may be composed of divisions 34A, each of which is associated with one of the individual electrodes 32, and which are connected by wirings 34B. The division 34A that is nearest to the reinforcing part 43 may be connected thereto. The pattern of the connection of the divisions 34A via the wirings 34B is not limited to that shown in FIG. 12. In the light of the prevention of capacitance generation, it is preferable that the divisions 34A be connected without overlapping vertically with the first wirings 35 for the individual electrodes 32. The third embodiment is same as the first embodiment except that the pattern of the common electrode is changed.

Modifications to the foregoing embodiments will be described below. The parts etc. in the modifications that are identical with the counterparts in the embodiment will be assigned the same reference numerals as the counterparts. Therefore, detailed descriptions of the modifications will be omitted.

First Modified Embodiment

In the embodiment described above, the common electrode 34 is formed over all of the individual electrodes 32, which are separated into a plurality of groups. Alternatively, a common electrode 34 may be formed for each group of individual electrodes 32. Obviously, however, in order to minimize the number of wirings 41 for connecting the common electrodes 34 and the driver IC 37, it is preferable that the groups of common electrodes 34 be small in number.

Second Modified Embodiment

It is not necessary that all three plates 10 to 13 of the channel unit 2 be formed of stainless steel. Rather, at least the cavity plate 10, which is laminated with the vibration plate 30 of the piezoelectric actuator 3, may be formed of stainless steel. The material that can be used for the cavity plate 10 is not limited to stainless steel. Rather, the cavity plate 10 may be formed of iron alloy other than stainless steel, nickel alloy, aluminum alloy or other material that makes it easy to form the pressure chambers 14 by etching. In order for the vibration plate 30 and the cavity plate 10 to have similar coefficients of thermal expansion for better joining between them, it is preferable that the vibration plate 30 be formed of iron alloy, nickel alloy, aluminum alloy or the like, as is the case with the cavity plate 10. It is particularly preferable that the vibration plate 30 and the cavity plate 10 be formed of the same material.

Third Modified Embodiment

The method for manufacturing the piezoelectric actuator 3 of the foregoing embodiment includes the step of heat-treating the piezoelectric layer 33 after forming this layer by an aerosol deposition method, a sol-gel method, a sputtering method or another method. Alternatively, the piezoelectric layer 33 can be formed by bonding a piezoelectric sheet composed of calcinated PZT to the insulating layer 31. In this case, a common electrode 34 is formed in advance on the top surface of the piezoelectric sheet by screen printing or the like. Then, the bottom surface of the piezoelectric sheet is joined to the top surfaces of the individual electrodes 32. Alternatively, a green sheet of PZT that can be calcinated at low temperature may be formed on the top surfaces of the individual electrodes 32 by screen printing or the like. In this case, the green sheet needs to be calcinated at a temperature between 850 and 900° C. at a later step.

Fourth Modified Embodiment

The driver IC 37 does not necessarily need to be positioned over the insulating layer 31. Rather, it is essential that at least the terminals 36, to which the output terminals 37a of the driver IC 37 are joined, be formed on the insulating layer 31.

Figure 13:
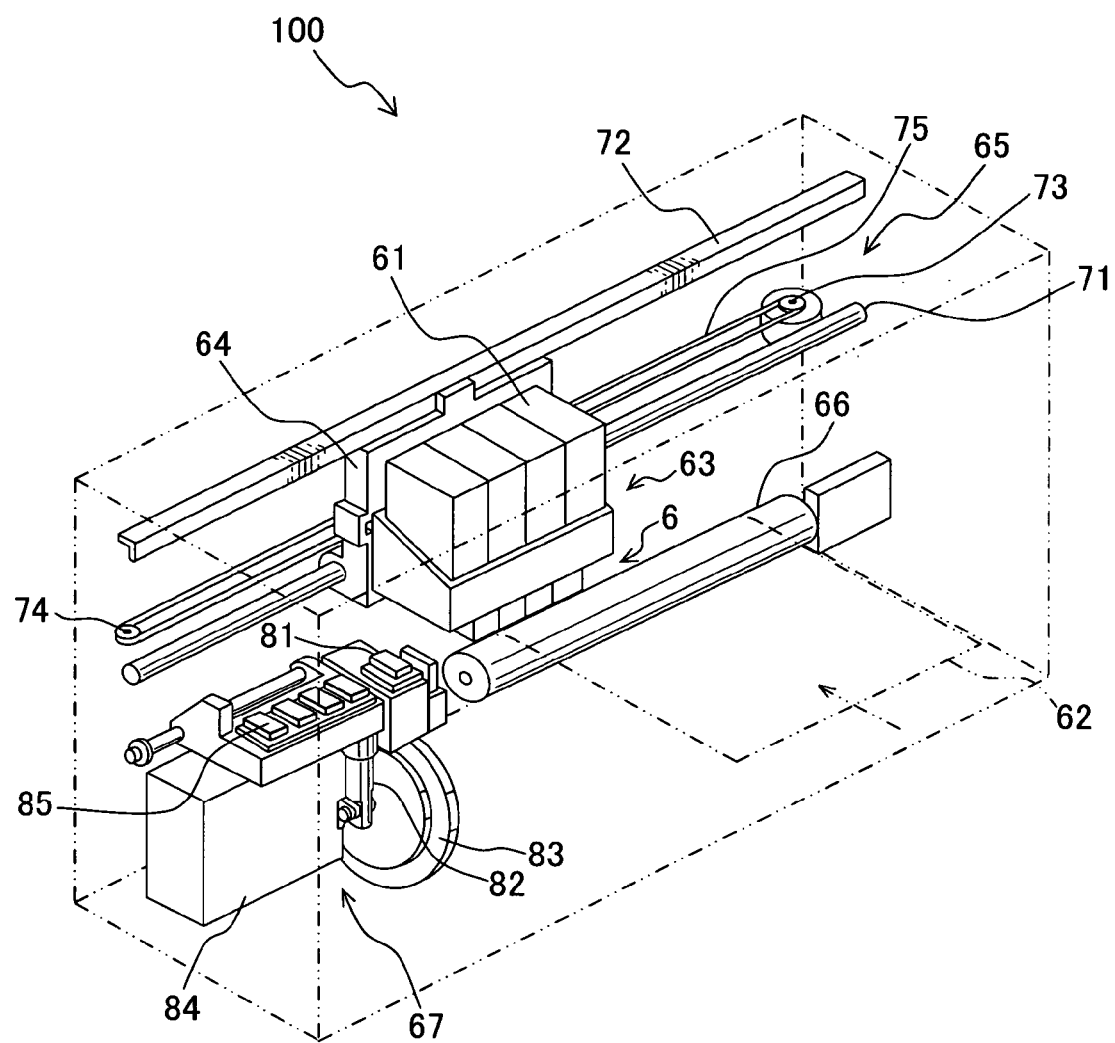
FIG. 13 schematically shows an embodiment of an ink-jet printer.

FIG. 13 shows a preferred embodiment of the ink-jet recording printer provided with the ink-jet head of the present invention. The ink-jet recording printer 100 shown in FIG. 13 includes four ink cartridges 61 which include respective colors of, for example, black, yellow, magenta, and cyan inks respectively, a head unit 63 which includes a multi-head 6 for discharging ink droplets onto printing paper 62, a carriage 64 on which the ink cartridges 61 and the head unit 63 are provided, a drive unit 65 which reciprocates the carriage 64 in the linear direction, a platen roller 66 which extends in the direction of the reciprocating motion of the carriage 64 and which is arranged opposingly to the multi-head 6, and a purge unit 67. The multi-head 6 includes an ink-jet head 1 of the above-described embodiment for each of the colors.

The drive unit 65 includes a carriage shaft 71, a guide plate 72, two pulleys 73, 74, and an endless belt 75. In this arrangement, the carriage shaft 71 and the guide plate 72 extend in parallel to the platen roller 66 to slidably support the carriage 64. The endless belt 75 is stretched between the pulleys 73, 74. When the pulley 73 is rotated in the positive direction and the opposite direction, the carriage 64, which is connected to the endless belt 75, makes the reciprocating motion in the linear direction along the carriage shaft 71 and the guide plate 72 in accordance with the positive rotation and the opposite rotation of the pulley 73.

The printing paper 62 is supplied from a printing paper cassette (not shown) which is connected to the ink-jet recording printer 100. The printing paper 62 is fed into the space between the multi-head 6 and the platen roller 66. The programmed printing is carried out thereon with the ink droplets discharged from the multi-head 6. After that, the printing paper 62 is discharged to the outside. The printing paper supply function and the printing paper discharge function are not shown in FIG. 13.

The purge unit 67 is installed on one side of the platen roller 66. The purge unit 67 includes a purge cap 81, a pump 82, a cam 83, and a drain ink reservoir 84. When the head unit 63 is placed at the position opposed to the purge cap 81, then the purge cap 81 is moved upwardly by the cam 83 to make contact with the nozzle surface of the multi-head 6, and a plurality of nozzles formed in the multi-head 6 are covered therewith. The ink contained in the multi-head 6 is sucked by the pump 82, and thus any ink having the increased viscosity and bubbles are discharged from the inside of the multi-head 6. The sucked ink is stored in the drain ink reservoir 84. The cap 85 is installed in order to prevent the ink from being dried. When the carriage 64 is returned to the reset position after the printing, the cap 85 covers the nozzles (not shown) of the multi-head 6 provided on the carriage 64.

What is claimed is:

1. A piezoelectric actuator comprising:
   a piezoelectric layer;
   a vibration plate provided on one side of the piezoelectric layer;
   a plurality of individual electrodes interposed between the piezoelectric layer and the vibration plate;
   a common electrode provided on the other surface of the piezoelectric layer and common to the individual electrodes;
   a plurality of first terminals formed on a same plane as the individual electrodes and each associated with one of the individual electrodes;
   a plurality of first wirings formed on the same plane as the individual electrodes and each electrically connecting one of the individual electrodes and one of the first terminals; and
   a drive unit which supplies drive voltage selectively to the individual electrodes is provided on the surface of the vibration plate, the drive unit having a plurality of output terminals joined to the individual electrodes via the first terminals and the first wirings,
   wherein the vibration plate is deformed by the deformation of the piezoelectric layer.

2. The piezoelectric actuator according to claim 1, wherein the vibration plate is a metallic vibration plate, further comprising:
   an insulating layer on a surface of the vibration plate, said insulating layer located between said vibration plate and the piezoelectric layer.

3. The piezoelectric actuator according to claim 2, further comprising:
   a second terminal formed on the surface of the insulating layer and associated with the common electrode; and
   a second wiring formed on the surface of the insulating layer and electrically connecting the common electrode and the second terminal.

4. The piezoelectric actuator according to claim 3, further comprising a drive unit which supplies drive voltage selectively to the individual electrodes, the drive unit being placed on the surface of the insulating layer, the drive unit having a plurality of output terminals joined to the first terminals and the second terminal.

5. The piezoelectric actuator according to claim 4, wherein the drive unit further has an input terminal, the piezoelectric actuator further comprising a connecting terminal which electrically connects the drive unit and a control unit which controls the drive unit, the connecting terminal being formed on the surface of the insulating layer, the connecting terminal being joined to the input terminal of the drive unit.

6. The piezoelectric actuator according to claim 2, wherein the insulating layer is formed of a ceramic material.

7. The piezoelectric actuator according to claim 2, wherein the insulating layer has a thickness of not more than 5 μm.

8. The piezoelectric actuator according to claim 7, wherein the insulating layer has a thickness of not more than 2 μm.

9. The piezoelectric actuator according to claim 2, wherein the common electrode is grounded.

10. An ink-jet head comprising:
the piezoelectric actuator as defined in claim 2; and
a channel unit having a plurality of pressure chambers and nozzles which discharge ink, the pressure chambers each communicating with one of the nozzles, the pressure chambers being open on a surface of the channel unit, and pressure chambers each being associated with one of the individual electrodes of the piezoelectric actuator;
wherein the vibration plate of the piezoelectric actuator is formed of any one of iron alloy, nickel alloy and aluminum alloy, and laid on the surface of a portion of the channel unit; and
wherein at least the portion of the channel unit on which the vibration plate is laid is formed of any one of iron alloy, nickel alloy and aluminum alloy.

11. The ink-jet head according to claim 10, wherein the vibration plate is formed of a same material as that of at least the portion of the channel unit on which the vibration plate is laid.

12. The ink-jet head according to claim 11, wherein the vibration plate and at least the portion of the channel unit on which the vibration plate is laid are formed of stainless steel.

13. An ink-jet printer provided with the ink-jet head as defined in claim 10.

14. The piezoelectric actuator according to claim 1, wherein the vibration plate is formed of metallic material, the piezoelectric actuator further comprising an insulating layer formed on the vibration plate.

15. The piezoelectric actuator according to claim 1, wherein the vibration plate is formed of insulating material.

16. The piezoelectric actuator according to claim 1, further comprising:
a second terminal formed on the same plane as the individual electrodes and associated with the common electrode; and
a second wiring formed on the same plane as the individual electrodes and electrically connecting the common electrode and the second terminal.

17. The piezoelectric actuator according to claim 16, wherein:
the plurality of individual electrodes, the first terminals, the second terminal, the first wirings and the second wiring are formed on a surface of the vibration plate; and
the drive unit has an output terminal joined to the second terminal.

18. The piezoelectric actuator according to claim 1, wherein the common electrode is grounded.

19. An ink-jet head comprising:
the piezoelectric actuator as defined in claim 1; and
a channel unit having a plurality of pressure chambers and nozzles which discharge ink, the pressure chambers each communicating with one of the nozzles, the pressure chambers being open on a surface of the channel unit, the pressure chambers each being associated with one of the individual electrodes of the piezoelectric actuator.

* * * * *